United States Patent
Yu

(10) Patent No.: US 8,762,902 B2
(45) Date of Patent: Jun. 24, 2014

(54) SYSTEM AND METHOD FOR DETECTING ONE OR MORE WINDING PATHS FOR PATTERNS ON A RETICLE FOR THE MANUFACTURE OF SEMICONDUCTOR INTEGRATED CIRCUITS

(75) Inventor: Kuei Mei Yu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 483 days.

(21) Appl. No.: 12/649,278

(22) Filed: Dec. 29, 2009

(65) Prior Publication Data

US 2010/0169852 A1 Jul. 1, 2010

(30) Foreign Application Priority Data

Dec. 31, 2008 (CN) .......................... 2008 1 0205389

(51) Int. Cl.
*G06F 17/50* (2006.01)

(52) U.S. Cl.
USPC ............. 716/55; 716/110; 716/111; 716/118; 716/119

(58) Field of Classification Search
USPC ........................................... 716/55
See application file for complete search history.

(56) References Cited

U.S. PATENT DOCUMENTS

| | | | |
|---|---|---|---|
| 2003/0163791 A1* | 8/2003 | Falbo et al. ....................... | 716/2 |
| 2004/0117748 A1* | 6/2004 | Tester .............................. | 716/11 |
| 2004/0268290 A1* | 12/2004 | Allen et al. ..................... | 716/21 |
| 2006/0277520 A1* | 12/2006 | Gennari .......................... | 716/21 |
| 2009/0125864 A1* | 5/2009 | Aton et al. ...................... | 716/19 |

* cited by examiner

*Primary Examiner* — Vuthe Siek
*Assistant Examiner* — Eric Lee
(74) *Attorney, Agent, or Firm* — Kilpatrick Townsend & Stockton LLP

(57) ABSTRACT

A system and method for detecting an invalid winding path in a layout design file includes generating a first reticle pattern file using a first path generation program, generating a second reticle pattern file using a second path generation program, comparing the first and second reticle patterns files to detect the invalid winding path. The invalid winding path includes one or more overlapping polygons.

21 Claims, 8 Drawing Sheets

SYSTEM AND METHOD FOR DETECTING ONE OR MORE WINDING PATHS FOR PATTERNS ON A RETICLE FOR THE MANUFACTURE OF SEMICONDUCTOR INTEGRATED CIRCUITS

CROSS-REFERENCES TO RELATED APPLICATIONS

This application claims priority to Chinese patent application no. 200810205389.8, filed Dec. 31, 2008, commonly assigned, incorporated by reference herein for all purposes.

BACKGROUND OF THE INVENTION

The present invention is directed to the manufacturing of integrated circuits. More particularly, the invention provides a system and method for detection and prevention of one or more errors in layout designs for reticles used in the manufacture of integrated circuits manufacturing process. Merely by way of example, the invention has been applied to a reticle layout design for the manufacture of integrated circuits at a foundry operation. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Semiconductor foundries often perform fabrication of semiconductor wafers for a variety of chip manufacturers that design integrated circuits. These chip manufacturers are often called "design houses" or "fab-less" chip companies. As a general business practice, design houses supply semiconductor foundries with layout designs in electronic form. The semiconductor foundries, upon reception of layout designs, which are generally in a particular electronic format contained in a computer medium, checks the layout designs. If the layout design, or the computer medium that contains the layout design, is determined to be proper, the layout design is then used for masking for a fabrication process. The layout design is provided on one or more reticle devices, which are used by "steppers" in the foundries.

Unfortunately, certain limitations exist with conventional methods for laying out the design for the integrated circuit. For example, these designs are often expensive to provide on one or more reticles. Additionally, the designs are often complex, which lead to errors in the design or pattern provided on the reticle. Additionally, the manufacture of reticles are often time consuming and requires specialized mask shops and the like. Furthermore, complex software, which can lead to errors, is often required to develop the layout designs. These and other limitations of conventional layout techniques can be found throughout the present specification and more particularly below.

From the above, it is seen that an improved method for manufacturing integrated circuits is desired.

BRIEF SUMMARY OF THE INVENTION

According to the present invention, techniques directed to the manufacturing of integrated circuits are provided. More particularly, the invention provides a system and method for detection and prevention of one or more errors in layout designs for reticles used in the manufacture of integrated circuits manufacturing process. Merely by way of example, the invention has been applied to a reticle layout design for the manufacture of integrated circuits at a foundry operation. But it would be recognized that the invention has a much broader range of applicability.

An embodiment of the present invention provides a method for a computer system for detecting invalid winding path in a layout design for the manufacture of electronic devices. As an example, the invalid winding path can have one or more intersecting polygons. The computer system can have one or more processors, a computer-readable storage device, and a user interface device. The method includes obtaining a first winding path parameter and obtaining a second winding path parameter. The method includes defining, with one or more of the computer processors, a first reticle pattern in accordance with the first winding path parameter, the first winding path parameter having a first value. The method also includes defining, with one or more of the computer processors, a second reticle pattern in accordance with the second winding path parameter, the second winding path parameter having a second value. The method further includes comparing, with one or more of the computer processors, the first reticle patterns against the second reticle patterns. The method also includes outputting, to the user interface device, data associated with the comparing the first reticle patterns against the second reticle patterns.

According to an embodiment, the present invention provides a method for detecting invalid winding path in a layout design, which includes at least one winding path to define one or more reticle patterns. A invalid winding path includes one or more intersecting polygons. The method includes the step of obtaining a first winding path parameter and a second winding path parameter. Additionally, the method includes defining a first plurality of reticle patterns in accordance with the first winding path parameter and the second winding path parameter. The first winding path parameter has a first value. The first plurality of reticle patterns is associated with the least one winding path. The method additionally includes defining a second plurality of reticle patterns in accordance with the second winding path parameter and the second winding path parameter. The first winding path parameter has a second value. The second plurality of reticle patterns is associated with the at least one winding path. Moreover, the method includes comparing the first plurality of reticle patterns against the second plurality of reticle patterns. The method also includes outputting a first plurality of data. The first plurality of data is associated with the comparing the first plurality of reticle patterns against the second plurality of reticle patterns.

According to another embodiment, the present invention provides a computer program product stored on a computer-read medium for detecting invalid winding path in a layout design. The invalid winding path includes one or more intersecting polygons, wherein the layout design including at least one winding path to define one or more reticle patterns. The computer program product includes code for obtaining a first winding path parameter and a second winding path parameter. Additionally, the computer program product includes code for defining a first plurality of reticle patterns in accordance with the first winding path parameter. The first plurality of reticle patterns is associated with the least one winding path. Additionally, the computer program product includes code for defining a second plurality of reticle patterns in accordance with the second winding path parameter. The second plurality of reticle patterns is associated with the at least one winding path. The computer program product also includes code for comparing the first plurality of reticle patterns against the second plurality of reticle patterns. The computer program product additionally includes code for outputting a first plurality of data. The first plurality of data is associated with the comparing the first plurality of reticle patterns against the second plurality of reticle patterns.

According to yet another embodiment, the present invention provides a computer system for detecting invalid winding path in a layout design. The invalid winding path includes one or more intersecting polygons. The layout design includes at least one winding path to define one or more reticle patterns. The computer system includes a data storage for store a plurality of codes. Additionally, the computer system includes a processor configure to execute the plurality of codes. The computer products also includes a user interface configured to receive a plurality of user inputs. The plurality of codes includes code for receiving a first winding path parameter and a second winding path parameter from a user via the user interface. Additionally, the plurality of codes includes code for defining a first plurality of reticle patterns in accordance with the first winding path parameter. The first plurality of reticle patterns is associated with the least one winding path. The plurality of codes also includes code for defining a second plurality of reticle patterns in accordance with the second winding path parameter. The second plurality of reticle patterns is associated with the at least one winding path. The plurality of codes additionally include codes for comparing the first plurality of reticle patterns against the second plurality of reticle patterns. The plurality of codes also include code for outputting a first plurality of data. The first plurality of data is associated with the comparing the first plurality of reticle patterns against the second plurality of reticle patterns.

According to yet another embodiment, the present invention provides a method for facilitating semiconductor fabrication involving at least two entities. A first entity of the at least two entities provides a layout design to a second entity of the at least two entities. The second entity manufactures semiconductor chips in accordance with the layout design. The method includes the second entity providing a first winding path parameter and a second winding path parameter. The method further includes the second entity generating a first plurality of reticle patterns and a second plurality of reticle patterns based on the layout design, wherein the first plurality of reticle patterns is based on a first value of the first winding path parameter. The second plurality of reticle patterns is based on a second value of the first winding path parameter. Additionally, the method includes the second entity comparing the first plurality of reticle patterns and the second plurality of reticle patterns to ensure that the layout design does not contain invalid winding path including one or more intersecting polygons. Furthermore, the method includes the second entity generating a first plurality of data based from the comparing the first plurality of reticle patterns and the second plurality of reticle patterns.

According to yet another embodiment, the present invention provides a method for manufacturing an integrated circuit device. The method includes providing a semiconductor wafer, the semiconductor wafer including a surface region. The method uses at least one reticle to form a pattern on one or more portions of the surface region. The at least one reticle is manufactured using one or more error checking processes, the one or more error checking processes. The error checking process includes obtaining a first winding path parameter. The error checking process also includes obtaining a second winding path parameter. Additionally, the error checking process includes defining a first plurality of reticle patterns in accordance with the first winding path parameter and the second winding path parameter. The first winding path parameter has a first value. The first plurality of reticle patterns is associated with the least one winding path. The error checking process additionally includes defining a second plurality of reticle patterns in accordance with the second winding path parameter and the second winding path parameter. The first winding path parameter has a second value. The second plurality of reticle patterns is associated with the at least one winding path. Additionally, the error checking process includes comparing the first plurality of reticle patterns against the second plurality of reticle patterns. In addition, the error checking process includes outputting data associated with the comparing the first plurality of reticle patterns against the second plurality of reticle patterns.

Depending upon the embodiment, one or more of these benefits may be achieved. According to various embodiments, the present invention provides a system and method for detecting illegal windings in a layout design. More specifically, according to certain embodiments, illegal windings involving one or more intersecting polygons are detected. The present invention better ensure that only correct layout design, which does not vary arbitrarily in one way or another, is converted to reticle patterns for the purpose of masking. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques directed to the manufacturing of integrated circuits are provided. More particularly, the present invention provides a system and method for detection and prevention of one or more errors in layout designs for reticles used in the manufacture of integrated circuits manufacturing process. Merely by way of example, the invention has been applied to a reticle layout design for the manufacture of integrated circuits at a foundry operation. But it would be recognized that the invention has a much broader range of applicability. Before describing details of the present invention, I have provided additional background information regarding the conventional techniques and my discovery of certain limitations, which have been overcome at least in part by the present methods and systems according to embodiments of the present invention.

Figure 1:
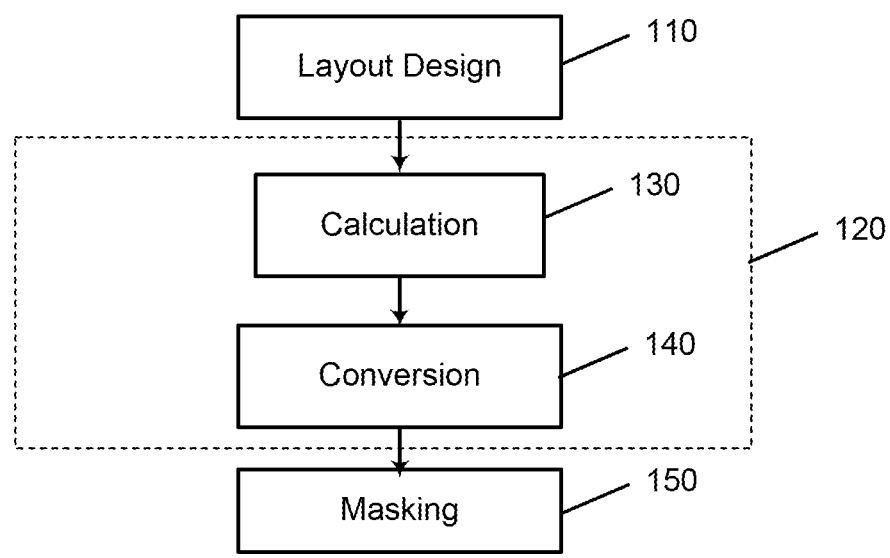
FIG. 1 is a simplified diagram for a conventional method for using a layout design for masking.

As merely an example, FIG. 1 is a simplified diagram for a conventional method 100 for forming a photomask from a layout design. The method includes, inter alia, obtaining a layout design file 110, performing conversion or calculation 120, and forming a mask 150. As an example, the method begins with obtaining a layout design at step 110 from a design house. The layout designs are generally in a computer format stored in a digital medium. For example, a layout design file is provided in a Graphic Data System format or a *.GDS file, which is commonly used in the industry, stored in a CD-ROM or other means. A layout design file in *.GDS format generally includes, inter alia, winding patterns at many different masking layers for fabrication. Once the semiconductor foundry receives the layout design from the design house, the semiconductor foundry performs conversion at step 120 so to convert the layout design to one or more reticle pattern for fabricating a photomask.

At step 120, at which conversion is performed, the fabrication laboratory first calculate the layout design at step 130. Generally, a functional stack-oriented programming language such as a CAT programming language is used to perform the calculation to convert winding information into a reticle pattern that is used for photomask. The winding information provides a perimeter or a boundary for a reticle pattern. After the conversion, a reticle pattern is produced from the layout design, the reticle pattern is converted into a machine readable format at step 140. After step 140, the layout design, or rather its converted version that is readable by a machine, is used for mask making at step 150.

Figure 2:
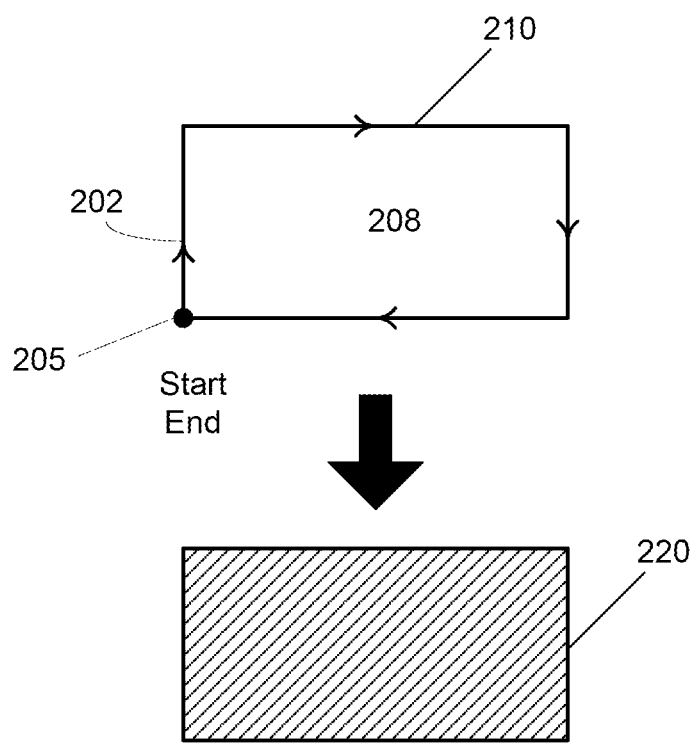
FIG. 2 illustrates a conversion process as performed by a CAT program.

FIG. 2 further illustrates a conversion process from a layout design to a reticle pattern according to an embodiment of the present invention. As shown, a layout design 210 is provided. The layout design 210 has a starting point at 205. A winding path 202 is in a clockwise fashion, indicated by arrows. The winding path terminates at the end point 205, and encloses a rectangular area 208. As shown, the starting point and the ending point for winding path 202 is the same at point 205. As a result, a well defined close rectangular area 208 is formed. The conversion process generally reads the layout design as a winding path and then define a pattern 220 accordingly.

The conversion process is capable of generating reticle patterns files under at least two sets of parameters. For example, the two sets of parameter are WINDPATH and WINDING. The WINDPATH parameter is related to the path or locus for forming the reticle pattern and controls how edges in reticle patterns are generated from layout designs. The WINDING parameter is related to an enclosed area or enclosed region formed from the reticle pattern.

As an example, the WINDPATH parameter may be set into one of the two options. Under the first option, the conversion method creates loops on the borders generated by expanding the winding path and takes each and every possible path into consideration, for example, overlapping patterns formed by some of the paths are included. The second calculation method refines the paths that may lead to overlapping pattern to form the layout design so that a proper final set of figures may be generated.

In a specific embodiment, the WINDING parameter, can include two options associated with the methodology used in converting a winding path into a polygon that encloses a closed area. The first option assumes a boundary line drawn through the center of the pattern and assign a value "+1" for a path going upwards from the boundary line and a value of "−1" for a path going downward from the boundary line. A sum of all the paths traversing the boundary line is calculated. If the sum is "0", then the closed area formed from the calculated paths provides for a reticle pattern. If the sum of all paths is not "0", the closed area formed from the paths is a hole. A second option uses an "odd and even rule." The second option also assigns a boundary line through the center of the pattern. For paths that go upward from the boundary line, a "+1" is assigned to the path. For paths that traverse and go downward from the boundary line, a "−1" is assigned. The sum of the values assigned to each path is calculated. If the sum is an odd number, the closed region formed from the paths is the reticle pattern. If the sum is even, then the paths form a hole. The terms "upward" and "downward" are to not intended to be limited. Of course there can be other variations, modifications, and alternatives.

Figure 3:
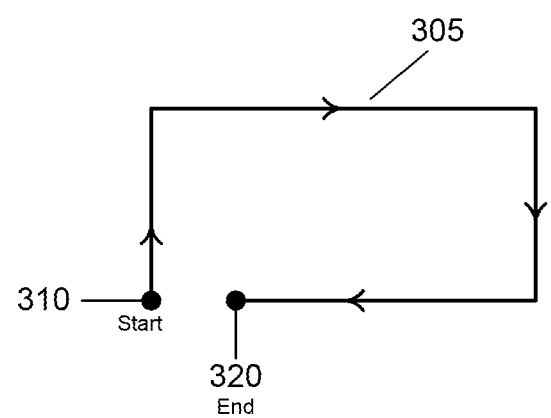
FIG. 3 illustrates an example of an invalid layout design that is detectable by a CAT program.

In a specific embodiment, the present method can detect invalidity in a layout design. FIG. 3 illustrates an example of an invalid layout design that is detectable by the method. As shown in FIG. 3, a winding path 305, as in a layout design, has a starting point 310, moving clockwise to have an end point 320. Since starting point 310 and the end point 320 are not the same point, or the starting point 310 and the end point 320 do not intersect or are not coincident, winding path 305 clearly does not define a closed region. As a result, the conversion process is unable to produce a reticle pattern from the layout design. Such obvious error is rather easy to detect and an error message is output. However, there are other types of errors that are not easily detected.

Figure 4:
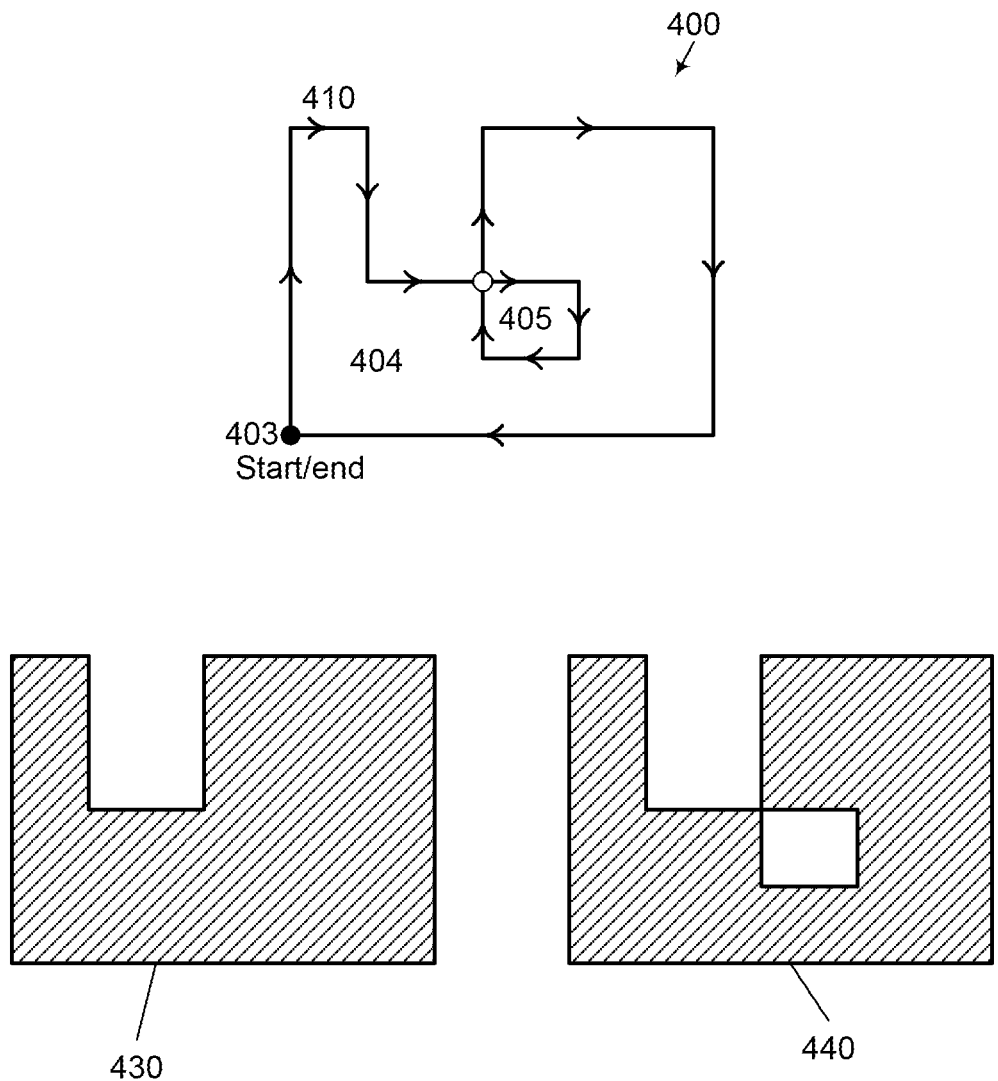
FIG. 4 illustrates an example of an error in a layout design that is undetectable by a CAT program.

FIG. 4 illustrates an example of errors in a layout design that can be undetectable by a conversion program. As shown, a layout design 400 has a winding path 410 that starts at the point 403 and ends at the same point 403. As explained above, layout design 400 is deemed proper by the analysis tool: starting point and ending point being the same suggests that the region enclosed by the winding path is a close region. However, the winding path 410 can be interpreted in another possible way. For example, the winding path 410 may be interpreted as enclosing a region 404, forming a reticle pattern 430. Alternatively, the winding path 410 may form closed regions 404 and 405, and forming a reticle pattern 440. The existence of two possibilities for a single design layout is an error as a semiconductor foundry does not know which of the two possibilities is intended by author of the layout design. As a result, the semiconductor foundry may produce an improper mask. Worse yet, there could be more than two possibilities for reticle patterns. Depending upon the embodiment, the present methods and system can be used to overcome limitations of conventional layout techniques used for the manufacture of integrated circuits. As shown in FIG. 4, from the paths or loci to form boundaries of a reticle pattern, reticle pattern 440 results if overlapping patterns are included. The conversion program can also further refine the overlapping pattern resulting in reticle pattern 430.

Again, refereeing to FIG. 4. Taking WINDING as an example, which is related to an enclosed area or region formed from the reticle pattern, the analysis tool can use the "0" or non "0" option to obtain reticle pattern 430 in FIG. 4. Alternatively, the conversion program can use "odd-even" option to obtain reticle pattern 440 in FIG. 4. Again, the conversion process cannot exclude one or the other reticle pattern as the right pattern based on the WINDING or WINDPATH algorithm resulting in an wrong photomask and a wrong integrated circuit being produced.

Figure 5:
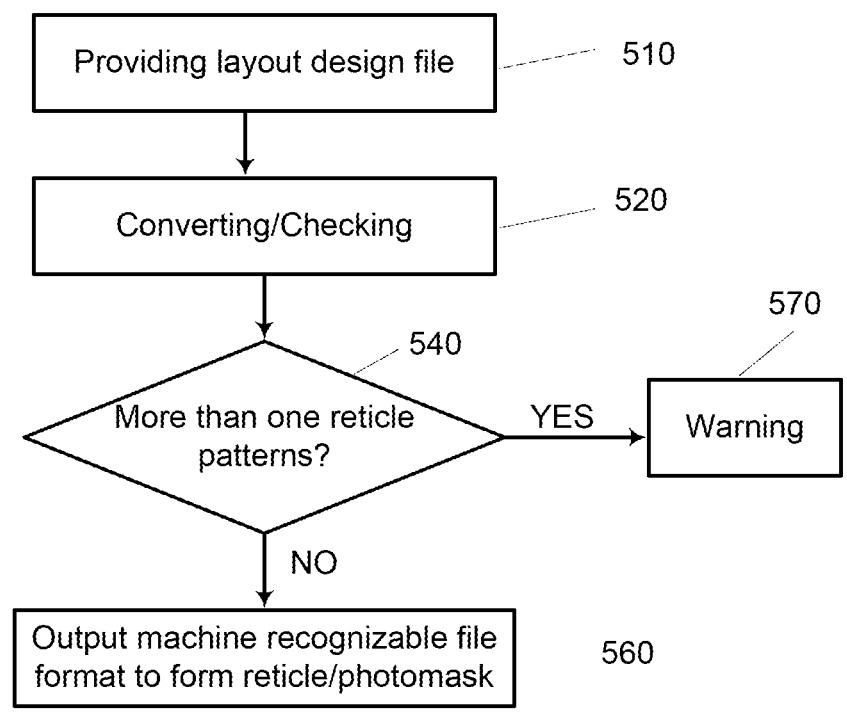
FIG. 5 is a simplified diagram illustrating an improved method for detecting errors for reticle patterns according to an embodiment of the present invention.

FIG. 5 is a simplified diagram illustrating an embodiment of an improved method for detecting errors for reticle patterns. This diagram is merely an example, which should not unduly limit the scope of the claims. One of ordinary skill in the art would recognize many variations, alternatives, and modifications. At step 510, a layout design is provided. As an example, a design house supplies a layout design, which is often in *.GDS format, to a semiconductor foundry for the purpose of fabrication. After the semiconductor foundry obtains the layout design, the semiconductor foundry converts the layout design into a machine readable format that may be used for defining reticle patterns at step 520. After conversion at step 520, the converted layout pattern, which is now reticle patterns in the machine readable format, photomask can be fabricated at step 560.

The conversion step 520 further includes an error detection step, a calculation step, and a first conversion step.

During the conversion step 520, the error detection step is performed first. According to an embodiment, the error detection step is specifically aimed at, inter alia, detect the specific type of illegal winding problem illustrated according to FIG. 4. As an example, at the error detection step, a special error checking application is used to perform error detection. The special error checking application is capable of parsing layout design files, which are usually in *.GDS format, and perform error detection for reticle patterns at different masking layers. The detail operation of the special error checking application is illustrated in FIG. 5a.

In a specific embodiment, an application analysis software "CKwin" may also be used for error detection in a layout design. Taking embodiment in FIG. 4 as an example. A layout design file is provided (Step 510) The "CKwin" program performs step 542 using a first path calculation scheme. For example, Step 542 can consider all paths possible in 400 in FIG. 4 including closed regions 404 and 405 to form a first reticle pattern (for example, 440 in FIG. 4) and save it as a "ye.cflt" file. The "CKwin" program then performs step 544 using a second calculation scheme to obtain a second reticle pattern. In the second calculation scheme, the "CKwin" program forms path using all possible overlapping patterns to refine the pattern, for example, only considering closed region 404 and not considering closed region 405 to produce pattern 430 in FIG. 4 and save it as a "no.cflt" file. The "CKwin" program then performs step 545. In a specific embodiment, step 545 compares and calculate the first reticle pattern and the second reticle pattern using pattern information from each pattern layer in the "ye.cflt" file and the "no.cflt" file. If the first reticle pattern and the second pattern are the same, then the difference or calculation result is "0." If there is difference in the calculated first reticle pattern and the calculated second reticle pattern, then the portions which are different will have a difference of "1".

Taking again FIG. 4 as an example, reticle patterns 430 and 440 are obviously different. The "CKwin" program will perform step 547 to verify that multiple reticle patterns can be obtained from the layout design file provided. Also in step 547, the difference in output files from each of the reticle patterns from the layout design are provided in a log file. Alternatively, a description of the difference between reticle patterns 430 and 440 can be provided in a XOR file, fro example, a xor.cflt file. Or both the log file and the XOR file can be provided to examine the differences.

Figure 5A:
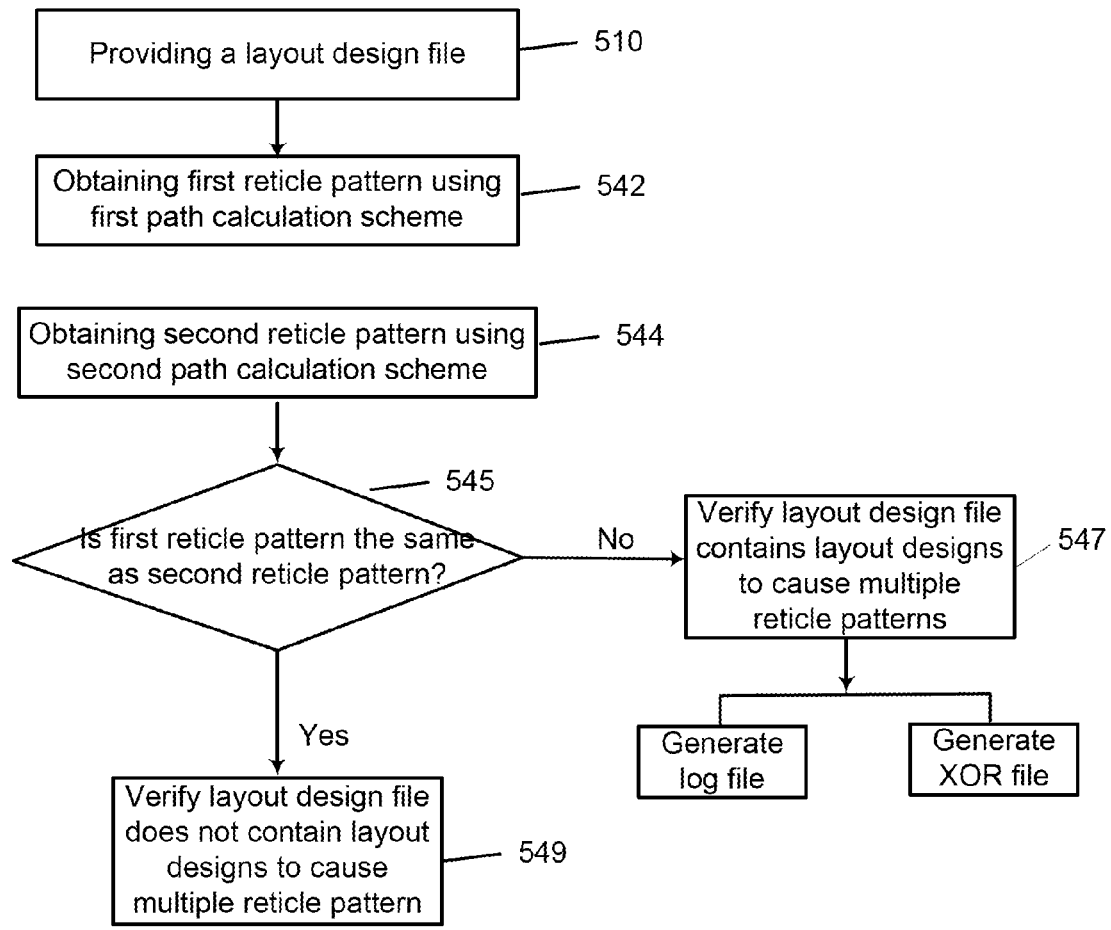
FIG. 5a is a simplified diagram illustrating an improved method for detecting errors in layout design for reticle pattern according to an embodiment of the present invention.

FIG. 5a is a simplified diagram illustrating an embodiment for an improved method for detecting errors in layout design for reticle pattern. This diagram is merely an example, which should not unduly limit the scope of the claims. One of ordinary skill in the art would recognize many variations, alternatives, and modifications. According to the embodiment, the "CKwin" program is used to implement the method for detecting errors in layout design. First the CKwin program reads and parses the layout design file provided at step 540. As an example, the "CKwin" program is capable of reading and parsing the layout design file in a substantially similar fashion as a CAT program. The CKwin program is capable of generating reticle pattern files using more than one parameters using WINDING or WINDPATH. According to an embodiment, the WINDPATH parameter is varied when the CKwin program checks for winding errors, and the WINDING parameter is set to apply the "non-zero" rule, that is, an enclosed region. At step 542, the CKwin program performs a first conversion path on the layout design file using WINDPATH to generate a first pattern file (for example 440 in FIG. 4) using all possible paths in 400. This would generate closed regions 404 and 405 and reticle pattern 440. The first pattern file is stored as a "ye.cflt" file. parameter is set to "Yes". As an example, a first pattern file named "*_ye.cflt" is generated at step 546. At step 542, which may performed before, after, or at the same time as the step 542, the CKwin program performs conversion on the layout design file using a second conversion path using, for example, WINDPATH to generate a second reticle pattern, for example, pattern 430 in FIG. 4. In this calculation scheme, CKwin further refines paths for overlapping pattern from the layout design and considers only closed region 404 and not closed region 405 resulting in reticle pattern 430. The second reticle pattern (for example, reticle pattern 430) is stored as a "no.cflt" file (step 548). Next at step 545, the CKwin program compares the "*_ye.clft" and "*_no.cflt" files. In a specific embodiment, CKwin program compares or calculate pattern information in each layer of *_ye.clft" and "*_no.cflt" files. If the first reticle pattern and the second reticle pattern are identical, then the difference or the calculated result will be all "0." If there exist a difference between the first reticle pattern and the second reticle pattern, the portion or portions that are different will have a calculated result "1." According to the present embodiment, an "exclusive or" (XOR) function is used to perform comparison. A log file and a differences in the two reticle pattern is stored in a "xor.cflt" file. In certain embodiment, the log file and/or the xor.cflt" file provide a warning for the layout designer or a line personnel to verify the correct reticle patterns to be used for a mask.

After comparing the two pattern files, the CKwin program generates two output files. At step 553, a log file is generated. As an example, the log file contains the result of pattern comparison at different layers of the reticle pattern. An exemplary log file contains messages as shown blow.

Layer 1;0 is O.K.!!
Layer 2;0 is O.K.!!
Layer 3;0 is O.K.!!
Layer 4;0 is O.K.!!
Layer 6;0 is O.K.!!
Layer 7;0 is O.K.!!
Layer 8;0 is O.K.!!
Layer 11;0 is O.K.!!
Layer 12;0 is O.K.!!
Layer 13;0 is O.K.!!
Layer 15;0 is O.K.!!
Layer 16;0 is O.K.!!
Layer 17;0 is O.K.!!
Layer 18;0 have non-zero result, please check !!!
Layer 19;0 is O.K.!!

As illustrated from the example, the log file shows a message stating that "Layer 18;0 have non-zero result, please check !!!", which indicates that the two reticle patterns are different in layer 18 and the difference is in the closed region 405.

At step 551, a third pattern file named "*_xor.cflt" is generated. The "*_xor.cflt" files contains, if any, the patterns contained in the "*_no.cflt" file that are different from the patterns contained in the "*_no.clft" file. According to the exemplary log message shown above, Layer 18 of the layout design file may contain different winding path. Accordingly the "*_xor.cflt" file contains the reticle patterns for Layer 18. As an example, the "*_xor.clft" file contains the reticle pattern 430 and the reticle pattern 440 from FIG. 4, generated from winding path 400 using different WINDPATH parameters. From the log file, layer 18 is different for reticle patterns 440 and 430. The difference corresponds to closed region 405. According to the present embodiment, if the reticle patterns contained in "*_xor.clft" file are different, it usually indicates that the layout design file contains an error. The XOR file and the log file may be output simultaneously to compare the reticle patterns in a specific embodiment.

Referring again to FIG. 5. Once the error detection program detects a difference, a warning is issued and a feedback is provided to the process line or the layout design file is sent back to the layout designer for correction and verification at step 570. Alternatively, if the error detection program does not detect differences, the layout design proceeds for calculation at step 530. According to the present embodiment, at the calculation step 530, a conversion program is used. The conversion program converts a layout design, which uses winding paths to define various regions for masking, into reticle patterns. As an example, a CAT program maybe used to convert layout design 210 in FIG. 2 into a reticle pattern 220.

As discussed above and further emphasized here, FIG. 5 and FIG. 5*a* illustrate an exemplary embodiment of the invention, which should not unduly limit the scope of the claims. One of ordinary skill in the art would recognize many variations, alternatives, and modifications. For example, at step 542 the CKwin program may vary more than one parameters in order to generate more than two reticle patterns for the purpose of comparison. Additionally, the "CKwin" can also use WINDING or closed regions to check and verify if an layout design file can output more than one reticle patterns. Of course one skilled in the art would recognize other variations, modifications, and alternatives.

Figure 6:
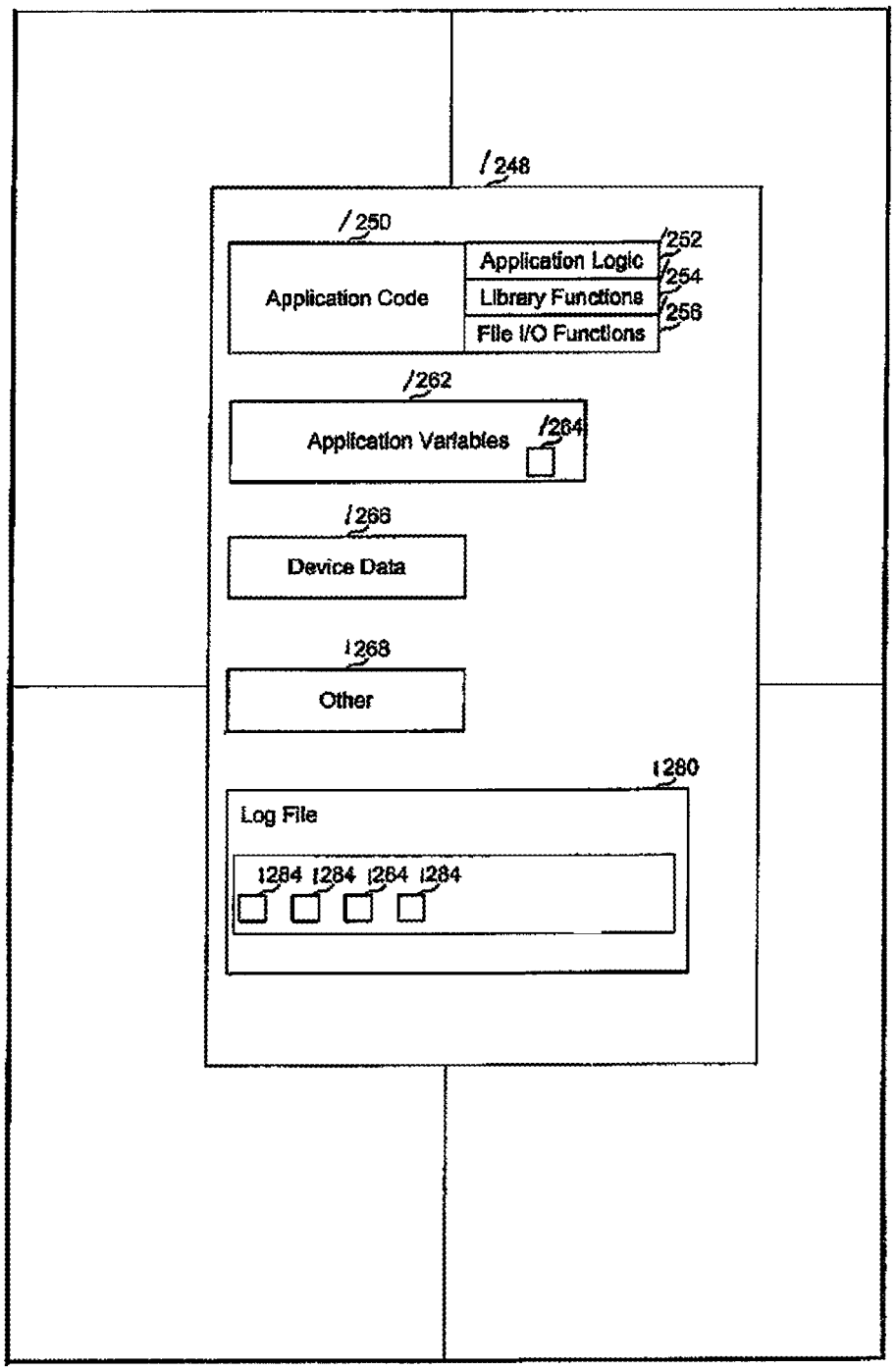
FIG. 6 is a simplified functional block diagram of a storage device having an application that can be accessed and executed by a processor in a computer system according to an embodiment of the present invention.

FIG. 6 is a simplified functional block diagram of a storage device 1248 having an application that can be accessed and executed by a processor in a computer system. This diagram is merely an example, which should not unduly limit the scope of the claims. One of ordinary skill in the art would recognize many variations, alternatives, and modifications. According to an embodiment, the application can be the CKwin software application stored in the storage device 1248. For example, the application may be stored on a local computer. As another example, the application may be stored on a network computer or on a database server.

The data storage 1248 can be one or more memory devices that can be accessed by a processor. As an example, the data storage 1248 is implemented using an array of hard drives. The data storage 1248 can include application code 1250 that can be configured to store one or more processor readable instructions. For example, the application code 1250 is the CKwin program in binary machine executable format. The application code 1250 can include application logic 1252, library functions 1254, and file I/O functions 1256 associated with the application.

The data storage 1248 can also include application variables 1262 that can include one or more storage locations configured to receive input variables. The application variables 1262 can include variables that are generated by the application or otherwise local to the application. The application variables 1262 can be generated, for example, from data retrieved from an external source, such as a user or an external device or application. For example, an user running the CKwin program may enter WINDING parameters from a keyboard. The processor can execute the application code 1250 to generate the application variables 1262 provided to the data store 1248.

One or more memory locations can be configured to store device data 1266. Device data 1266 can include data that is sourced by an external source, such as a user or an external device. The device data 1266 can include, for example, parameters or variables, which can be use for one or more applications, that are to be entered by an user.

The data storage 1248 can also include a log file 1280 having one or more storage locations 1284 configured to store results of the application or inputs provided to the application. For example, the log file 1280 can be configured to store a log file generated by the CKwin program.

Figure 7:
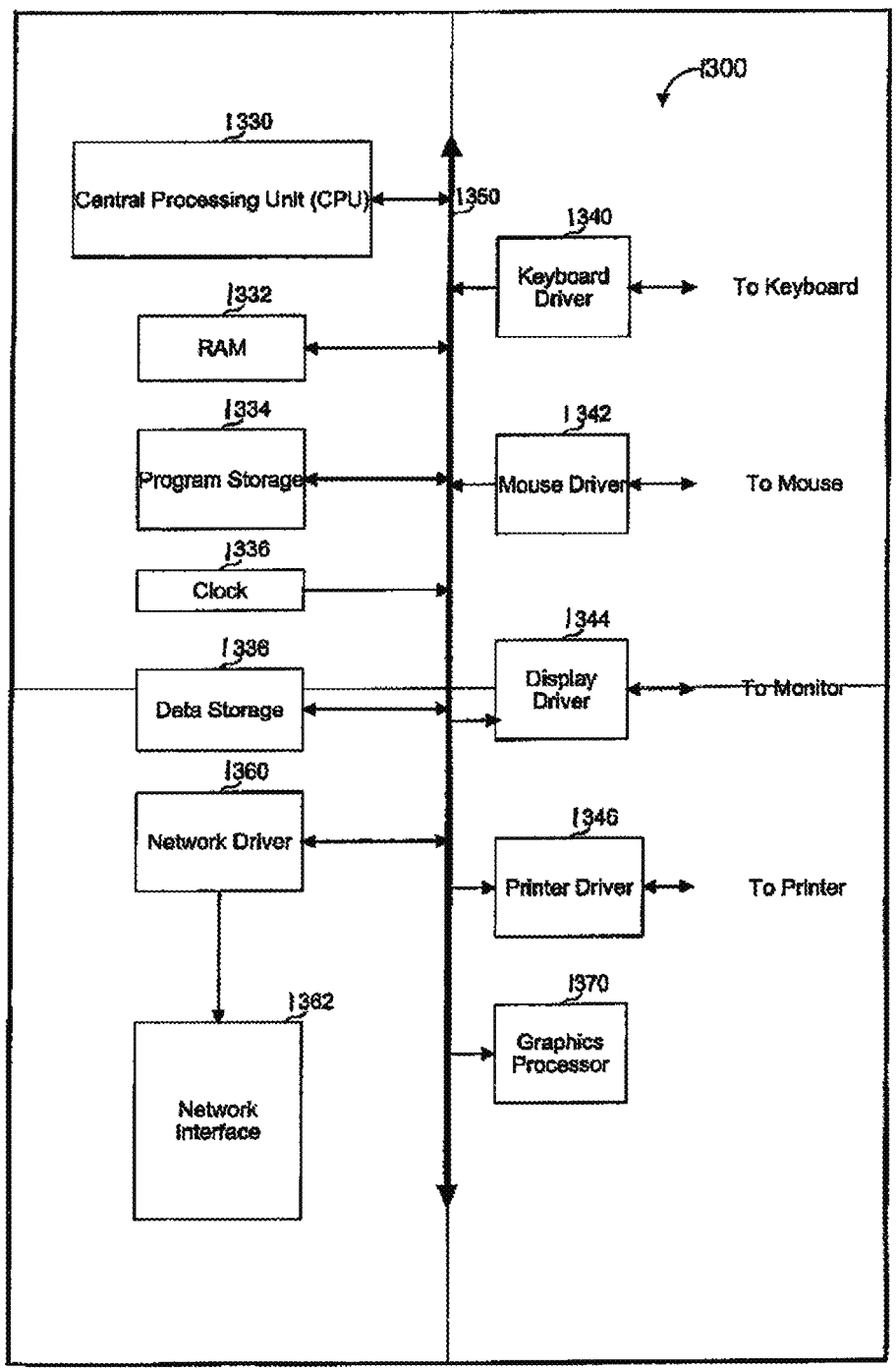
FIG. 7 is a simplified functional block diagram of an embodiment of a computer according to an embodiment of the present invention.

FIG. 7 is a simplified functional block diagram of an embodiment of a computer. This diagram is merely an example, which should not unduly limit the scope of the claims. One of ordinary skill in the art would recognize many variations, alternatives, and modifications. The CKwin program may be carried by the computer. The computer 1300 can be configured to implement a data storage to support an application.

The computer 1300 can include a Central Processing Unit (CPU) 1330 coupled to one or more associated devices over a bus 1350. The CPU 1330 can be a general purpose processor a Reduced Instruction Set Computer (RISC) processor, or a combination of processors that can include, for example, a general purpose processor and a digital signal processor. As an example, the CPU 1330 is used to execute the CKwin program.

Although the bus 1350 is shown as a single bus, the bus 1350 can include multiple buses or communication links. For example, the computer 1300 can implement a first bus that is configured to couple the CPU 1330 to local memory, such as RAM 1332. The computer 1330 can also include one or more additional buses that are used to couple the CPU 1330 to peripheral devices.

The CPU 1330 can be configured to access program storage 1334 to retrieve and execute an application stored therein. Program storage 1334 can be any type of memory, and can be implemented as internal memory or removable memory. For example, program storage can include a hard disk, ROM, or some other type of memory.

The computer 1300 can also include RAM 1332 and data storage 1336 typically used for temporary storage of data. The combination of RAM 1332, program storage 1334, and data storage 1336 can be configured as a data store. The computer 1300 can include a clock 1336 or time keeping device configured to track time for applications that are time or date related.

The computer 1300 can also include one or more peripheral devices configured as input/output (I/O) devices or as devices supporting or otherwise related to I/O devices. The peripheral devices can include a network driver 1360 coupled to the bus 1350 and configured to communicate with a network interface device 1362. The network interface device 1362 can be configured to interface the computer 1300 with a network. As an example, the computer 1300 receives layout design files via the network interface device 1362.

The peripheral devices can also include, for example, a keyboard driver 1340 coupled to the bus 1350 that is configured to interface a keyboard to the computer 1300. Similarly, the computer 1300 can include a mouse driver 1342, display driver 1344, and printer driver 1346, among others.

The computer 1300 can also include a separate graphics processor 1370 configured to operate with graphics intensive applications in order to reduce the processing load on the CPU 1330. In some embodiments, the graphics processor 1370 can be implemented with the display driver 1344, for example, in a graphics card.

According to an embodiment, the present invention provides a method for detecting invalid winding path in a layout design, which includes at least one winding path to define one or more reticle patterns. A invalid winding path includes one or more intersecting polygons. The method includes the step of obtaining a first winding path parameter and a second winding path parameter. Additionally, the method includes defining a first plurality of reticle patterns in accordance with the first winding path parameter and the second winding path parameter. The first winding path parameter has a first value. The first plurality of reticle patterns is associated with the least one winding path. The method additionally includes defining a second plurality of reticle patterns in accordance with the second winding path parameter and the second winding path parameter. The first winding path parameter has a second value. The second plurality of reticle patterns is associated with the at least one winding path. Moreover, the method includes comparing the first plurality of reticle patterns against the second plurality of reticle patterns. The method also includes outputting a first plurality of data. The first plurality of data is associated with the comparing the first plurality of reticle patterns against the second plurality of reticle patterns. As an example, the present embodiment is illustrate according to FIGS. 5 to 7.

According to another embodiment, the present invention provides a computer program product stored on a computer-read medium for detecting invalid winding path in a layout design. The invalid winding path includes one or more intersecting polygons, wherein the layout design including at least one winding path to define one or more reticle patterns. The computer program product includes code for obtaining a first winding path parameter and a second winding path parameter. Additionally, the computer program product includes code for defining a first plurality of reticle patterns in accordance with the first winding path parameter. The first plurality of reticle patterns is associated with the least one winding path. Additionally, the computer program product includes code for defining a second plurality of reticle patterns in accordance with the second winding path parameter. The second plurality of reticle patterns is associated with the at least one winding path. The computer program product also includes code for comparing the first plurality of reticle patterns against the second plurality of reticle patterns. The computer program product additionally includes code for outputting a first plurality of data. The first plurality of data is associated with the comparing the first plurality of reticle patterns against the second plurality of reticle patterns. As an example, the present embodiment is illustrate according to FIGS. 5 to 7.

According to yet another embodiment, the present invention provides a computer system for detecting invalid winding path in a layout design. The invalid winding path includes one or more intersecting polygons. The layout design includes at least one winding path to define one or more reticle patterns. The computer system includes a data storage for store a plurality of codes. Additionally, the computer system includes a processor configure to execute the plurality of codes. The computer products also includes a user interface configured to receive a plurality of user inputs. The plurality of codes includes code for receiving a first winding path parameter and a second winding path parameter from a user via the user interface. Additionally, the plurality of codes includes code for defining a first plurality of reticle patterns in accordance with the first winding path parameter. The first plurality of reticle patterns is associated with the least one winding path. The plurality of codes also includes code for defining a second plurality of reticle patterns in accordance with the second winding path parameter. The second plurality of reticle patterns is associated with the at least one winding path. the plurality of codes additionally includes code for comparing the first plurality of reticle patterns against the second plurality of reticle patterns. The plurality of codes also include code for outputting a first plurality of data. The first plurality of data is associated with the comparing the first plurality of reticle patterns against the second plurality of reticle patterns. As an example, the present embodiment is illustrate according to FIGS. 5 to 7.

According to yet another embodiment, the present invention provides a method for facilitating semiconductor fabrication involving at least two entities. A first entity of the at least two entities provides a layout design to a second entity of the at least two entities. The second entity manufactures semiconductor chips in accordance with the layout design. The method includes the second entity providing a first winding path parameter and a second winding path parameter. The method further includes the second entity generating a first plurality of reticle patterns and a second plurality of reticle patterns based on the layout design, wherein the first plurality of reticle patterns is based on a first value of the first winding path parameter. The second plurality of reticle patterns is based on a second value of the first winding path parameter. Additionally, the method includes the second entity comparing the first plurality of reticle patterns and the second plurality of reticle patterns to ensure that the layout design does not contain invalid winding path including one or more intersecting polygons. Furthermore, the method includes the second entity generating a first plurality of data based from the comparing the first plurality of reticle patterns and the second plurality of reticle patterns. As an example, the present embodiment is illustrate according to FIGS. 5 to 7.

According to yet another embodiment, the present invention provides a method for manufacturing an integrated circuit device. The method includes providing a semiconductor wafer, the semiconductor wafer including a surface region. The method uses at least one reticle to form a pattern on one or more portions of the surface region. The at least one reticle is manufactured using one or more error checking processes, the one or more error checking processes. The error checking process includes obtaining a first winding path parameter. The error checking process also includes obtaining a second winding path parameter. Additionally, the error checking process includes defining a first plurality of reticle patterns in accordance with the first winding path parameter and the second winding path parameter. The first winding path parameter has a first value. The first plurality of reticle patterns is associated with the least one winding path. The error checking process additionally includes defining a second plurality of reticle patterns in accordance with the second winding path parameter and the second winding path parameter.

The first winding path parameter has a second value. The second plurality of reticle patterns is associated with the at least one winding path. Additionally, the error checking process includes comparing the first plurality of reticle patterns against the second plurality of reticle patterns. In addition, the error checking process includes outputting data associated with the comparing the first plurality of reticle patterns against the second plurality of reticle patterns. As an example, the present embodiment is illustrate according to FIGS. 5 to 7.

Depending upon the embodiment, one or more of these benefits may be achieved. According to various embodiments, the present invention provides a system and method for detecting illegal windings in a layout design. More specifically, according to certain embodiments, illegal windings involving one or more intersecting polygons are detected. The present invention better ensure that only correct layout design, which does not vary arbitrarily in one way or another, is converted to reticle patterns for the purpose of masking.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for a computer system for detecting an invalid winding path in a layout design for the manufacture of electronic devices, the invalid winding path including one or more overlapping polygons, the computer system having one or more processors, a computer-readable storage device, and a user interface device, the method comprising:
   providing a layout design file having at least one pattern layer, the at least one pattern layer having a winding path;
   generating a first reticle pattern from the winding path using a first calculation scheme by means of the one or more processors;
   generating a second reticle pattern from the winding path using a second calculation scheme by means of the one or more processors;
   comparing the first reticle pattern with the second reticle pattern; and
   in the event that there is no match:
   outputting a text message indicating a presence of one or more overlapping polygons; and
   in the event that there is a match: generating a reticle pattern file.

2. The method of claim 1 wherein the layout design file is provided to a semiconductor foundry.

3. The method of claim 1 wherein the layout design file is in a GDS format.

4. The method of claim 1 wherein the reticle pattern file is used in a masking process of semiconductor device fabrication.

5. A computer-implemented method for detecting an invalid winding path in a layout design file for the manufacture of electronic devices, the layout design file including at least one winding path to define one or more reticle patterns, the method comprising:
   generating a first reticle pattern associated with the at least one winding path by means of one or more processing units;
   generating a second reticle pattern associated with the at least one winding path by means of the one or more processing units; and
   comparing the first reticle pattern with the second reticle pattern to obtain a difference, wherein the difference is characterized by a presence of one or more polygons in the first reticle pattern or in the second reticle pattern.

6. The computer-implemented method of claim 5 wherein the first reticle pattern comprises a plurality of non-overlapping polygons and the second reticle pattern comprises the one or more overlapping polygons.

7. The computer-implemented method of claim 5 wherein the comparing includes an XOR operation.

8. The computer-implemented method of claim 5 further comprising outputting a text message signaling that the first and second reticle patterns are not the same.

9. The computer-implemented method of claim 5 further comprising generating a data file in the event that the first and second reticle patterns are different.

10. The computer-implemented method of claim 9 wherein the data file includes a log file.

11. A computer program product stored on a non-transitory computer readable medium for detecting an invalid winding path in a layout design file, the invalid winding path including one or more overlapping polygons, wherein the layout design file includes at least one winding path to define one or more reticle patterns, the computer program product comprising:
   code for defining a first plurality of reticle patterns, the first plurality of reticle patterns being associated with the at least one winding path;
   code for defining a second plurality of reticle patterns, the second plurality of reticle patterns being associated with the at least one winding path;
   code for comparing the first plurality of reticle patterns with the second plurality of reticle patterns;
   code for outputting a data file and a text message indicating a presence of one or more overlapping polygons in the event that the comparison of the first plurality of reticle patterns with the second plurality of reticle patterns does not produce a match.

12. A computer system for detecting an invalid winding path in a layout design file, the layout design file including at least one winding path to define one or more reticle patterns, the computer system comprising:
   a data storage for storing a plurality of codes;
   a processor configured to execute the plurality of codes; and
   a user interface configured to receive a plurality of user inputs;
   wherein the plurality of codes comprises:
   code for defining a first plurality of reticle patterns, the first plurality of reticle patterns being associated with the least one winding path;
   code for defining a second plurality of reticle patterns, the second plurality of reticle patterns being associated with the at least one winding path;
   code for comparing the first plurality of reticle patterns with the second plurality of reticle patterns to obtain a difference, wherein the difference is characterized by a presence of one or more polygons in the first plurality of reticle patterns or in the second plurality of reticle patterns.

13. A computer-implemented method for facilitating semiconductor fabrication involving at least two entities, wherein a first entity of the at least two entities provides a layout design file to a second entity of the at least two entities, the second entity manufacturing semiconductor chips in accordance with the layout design file, the method comprising:
   generating using the second entity a first plurality of reticle patterns having no overlapping polygons and a second plurality of reticle patterns based on the layout design file, wherein the first plurality of reticle patterns is based on a first value of a first winding path parameter, the second plurality of reticle patterns is based on a second value of the first winding path parameter;

comparing using the second entity the first plurality of reticle patterns and the second plurality of reticle patterns to ensure that the layout design file does not contain an invalid winding path including one or more overlapping polygons; and generating using the second entity a data file based from the result of the comparison of the first plurality of reticle patterns and the second plurality of reticle patterns.

14. The method of claim 13 wherein the second entity sends the layout design file and the data file to the first entity in the event that the layout design file contains one or more overlapping polygons.

15. A method for manufacturing an integrated circuit device, the method comprising:

providing a semiconductor wafer, the semiconductor wafer including a surface region;

using at least one reticle to form a pattern on one or more portions of the surface region, the at least one reticle being manufactured using one or more error checking processes, the one or more error checking processes including:

providing a layout design file having at least one winding path;

obtaining a first plurality of reticle patterns using a first program, the first plurality of reticle patterns being associated with the least one winding path, the first plurality of reticle patterns having no overlapping polygons;

obtaining a second plurality of reticle patterns using a second program, the second plurality of reticle patterns being associated with the at least one winding path, the second plurality of reticle patterns having one or more overlapping polygons;

comparing the first plurality of reticle patterns against the second plurality of reticle patterns to identify a layer containing the one or more overlapping polygons in the second plurality of reticle patterns; and outputting a data file indicating at least the identified layer.

16. The method of claim 15 wherein the surface region comprises one or more metal regions.

17. The method of claim 15 wherein the surface region comprises one or more dielectric regions.

18. A computer-implemented method for forming a reticle pattern from a layout design file, comprising:

providing a layout design file having a winding path;

determining whether the winding path includes one or more completely overlapping polygons;

in the event that the winding path does not include one or more completely overlapping polygons:

forming a reticle pattern by a process executed on one or more processing units; and converting by means of the one or more processing units the reticle pattern to a machine recognizable file format for forming a photomask; and in the event that the winding path includes one or more completely overlapping polygons:

outputting a warning message.

19. The method of claim 18 further comprising:

forming a second reticle pattern including the one or more completely overlapping polygons; and comparing the first reticle pattern and the second reticle pattern.

20. The method of claim 19 wherein the comparing comprises an XOR function.

21. The method of claim 19 further comprises:

providing a data file based on the result of the comparison.

* * * * *